(12) United States Patent
Kojima

(10) Patent No.: US 9,881,890 B2
(45) Date of Patent: Jan. 30, 2018

(54) SEMICONDUCTOR MODULE, BONDING JIG, AND MANUFACTURING METHOD OF SEMICONDUCTOR MODULE

(71) Applicant: OLYMPUS CORPORATION, Tokyo (JP)

(72) Inventor: Kazuaki Kojima, Suwa (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/284,714

(22) Filed: Oct. 4, 2016

(65) Prior Publication Data

US 2017/0025372 A1   Jan. 26, 2017

Related U.S. Application Data

(63) Continuation of application No. PCT/JP2015/052000, filed on Jan. 26, 2015.

(30) Foreign Application Priority Data

Apr. 16, 2014 (JP) .................. 2014-084809

(51) Int. Cl.
*H01L 23/00* (2006.01)
*H05K 3/36* (2006.01)
(Continued)

(52) U.S. Cl.
CPC .......... *H01L 24/16* (2013.01); *H01L 21/4857* (2013.01); *H01L 23/4985* (2013.01);
(Continued)

(58) Field of Classification Search
CPC .............. H01L 24/16; H01L 23/49822; H01L 23/49833; H01L 21/4857; H01L 23/4985; H01L 23/49894; H01L 24/75; H01L 24/81; H01L 27/14636; H05K 3/363; H05K 3/4691
See application file for complete search history.

(56) References Cited

U.S. PATENT DOCUMENTS 5,760,465 A   6/1998  Alcoe et al.
6,040,624 A * 3/2000  Chambers ........... H01L 23/4985
                                                  257/668

(Continued)

FOREIGN PATENT DOCUMENTS

EP   0 788 158 A2   8/1997
EP   1 065 555 A1   1/2001
(Continued)

OTHER PUBLICATIONS

International Search Report dated Apr. 14, 2015 issued in International Application No. PCT/JP2015/052000.

*Primary Examiner* — William Coleman
(74) *Attorney, Agent, or Firm* — Scully, Scott, Murphy & Presser, P.C.

(57) ABSTRACT

A semiconductor module includes an image pickup device on which a bump is disposed, and a flexible wiring board having a flexible resin as a base and including a wire having a bonding electrode at a distal end portion solder-bonded to the bump, in which the bonding electrode is pressed against the bump by bending/deformation of the wiring board caused by application of heat to a solder bonding temperature.

9 Claims, 5 Drawing Sheets

(51) Int. Cl.
*H05K 3/46* (2006.01)
*H01L 21/48* (2006.01)
*H01L 23/498* (2006.01)
*H01L 27/146* (2006.01)

(52) U.S. Cl.
CPC .. *H01L 23/49822* (2013.01); *H01L 23/49833* (2013.01); *H01L 23/49894* (2013.01); *H01L 24/75* (2013.01); *H01L 24/81* (2013.01); *H01L 27/14636* (2013.01); *H05K 3/363* (2013.01); *H05K 3/4691* (2013.01); *H01L 2224/13111* (2013.01); *H01L 2224/13118* (2013.01); *H01L 2224/13124* (2013.01); *H01L 2224/13139* (2013.01); *H01L 2224/13147* (2013.01); *H01L 2224/16238* (2013.01); *H01L 2224/50* (2013.01); *H01L 2224/81193* (2013.01); *H01L 2224/81203* (2013.01); *H01L 2224/81801* (2013.01); *H01L 2924/014* (2013.01); *H01L 2924/12043* (2013.01); *H05K 2201/068* (2013.01)

(56) References Cited

U.S. PATENT DOCUMENTS

| | | | | |
|---|---|---|---|---|
| 6,091,475 | A | * | 7/2000 | Ogino .................... G09G 3/006 257/693 |
| 8,729,689 | B2 | * | 5/2014 | Hwang ............... H01L 23/3128 257/686 |
| 2004/0231878 | A1 | | 11/2004 | Higashida et al. |
| 2007/0012475 | A1 | * | 1/2007 | Kawaguchi ............ H05K 3/361 174/255 |
| 2011/0199735 | A1 | * | 8/2011 | Kawabata ............. H05K 3/361 361/721 |

FOREIGN PATENT DOCUMENTS

| | | |
|---|---|---|
| JP | H09-213837 A | 8/1997 |
| JP | 2004-342969 A | 12/2004 |
| JP | 2009-147180 A | 7/2009 |
| JP | 2010-205915 A | 9/2010 |
| JP | 2013-141043 A | 7/2013 |
| WO | 00/043834 A1 | 7/2000 |

\* cited by examiner

US 9,881,890 B2

SEMICONDUCTOR MODULE, BONDING JIG, AND MANUFACTURING METHOD OF SEMICONDUCTOR MODULE

CROSS REFERENCE TO RELATED APPLICATION

This application is a continuation application of PCT/JP2015/052000 filed on Jan. 26, 2015 and claims benefit of Japanese Application No. 2014-084809 filed in Japan on Apr. 16, 2014, the entire contents of which are incorporated herein by this reference.

BACKGROUND OF INVENTION

1. Field of the Invention

The present invention relates to a semiconductor module having a bonding electrode of a flexible wiring board solder-bonded to an external electrode of a semiconductor device, a bonding jig used for manufacturing the semiconductor module, and a manufacturing method of the semiconductor module.

2. Description of the Related Art

A semiconductor module is manufactured by solder-bonding together an external electrode of a semiconductor device and a bonding electrode of a flexible wiring board. A plurality of external electrodes of the semiconductor device are disposed on a highly flat semiconductor substrate.

Japanese Patent Application Laid-Open Publication No. 2013-141043 discloses a bonding method by which poor bonding is prevented by changing a pressure according to a predetermined pattern at the time of ultrasonic bonding of an external electrode of a semiconductor device and a bonding electrode of a flexible wiring board. That is, the two are compressed together before ultrasonic bonding and the electrodes are plastically deformed so that a plurality of bonding portions are placed in a predetermined contact state at the time of ultrasonic bonding.

SUMMARY OF THE INVENTION

A semiconductor module according to an embodiment of the present invention includes a semiconductor device on which a first electrode is disposed, and a flexible wiring board including a wire having a second electrode at a distal end portion solder-bonded to the first electrode, wherein the wiring board includes a laminate substrate in which a plurality of substrates with different thermal expansion coefficients are laminated, and the second electrode is pressed against the first electrode by bending/deformation of the wiring board caused by application of heat to a solder bonding temperature and by a difference in the thermal expansion coefficients of the plurality of substrates.

A bonding jig according to another embodiment is a bonding jig used for heating and bonding together a first electrode disposed on a semiconductor device and a second electrode at a distal end portion of a wire of a wiring board, in which the bonding jig has a bi-metal function of bending and deforming the wiring board being held by the bonding jig when heated.

Also, a manufacturing method of a semiconductor module according to another embodiment includes manufacturing a semiconductor device on which a first electrode is disposed, manufacturing a flexible wiring board including a wire having a second electrode at a distal end portion, and a laminate substrate in which the wire is disposed, disposing the first electrode and the second electrode close to each other, and solder-bonding the semiconductor device and the wiring board, in which the second electrode is pressed against the first electrode by being heated to a solder bonding temperature.

DETAILED DESCRIPTION OF THE PREFERRED EMBODIMENTS

First Embodiment

Figure 1:
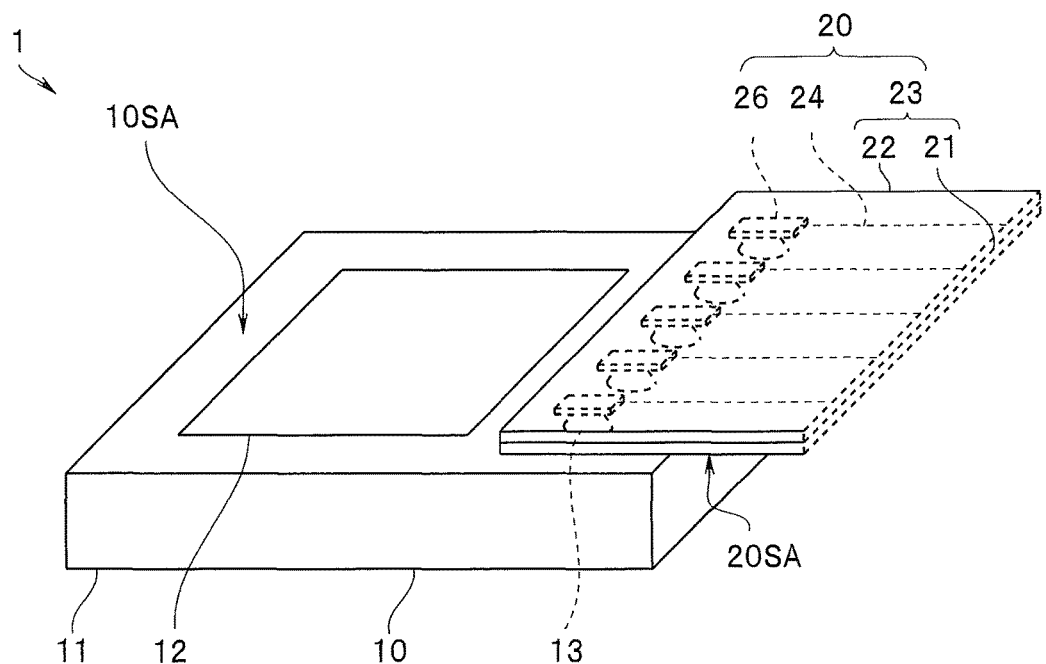
FIG. 1 is a perspective view of a semiconductor module of a first embodiment.

As shown in FIG. 1, a semiconductor module 1 of the present embodiment is an image pickup module including an image pickup device 10, which is a semiconductor device, and a flexible wiring board (hereinafter referred to also as a "wiring board") 20. Note that, in the following description, the drawings based on the embodiments are only schematic, and the relationship between thickness and width of each part, the ratio of thicknesses of the parts, and the like are different from reality, and also, the relationship or the ratio of the dimensions may be different between the drawings.

The image pickup device 10 is configured from a substantially cuboid silicon semiconductor, for example. The image pickup device 10 is manufactured by cutting a semiconductor wafer on which a plurality of image pickup devices are formed by a known semiconductor process. For example, a light receiving surface 10SA of the image pickup device 10 is 500 μm×500 μre and 1000 μm×1000 μm or less, and its thickness is 100 μm or more and 300 μm or less. The semiconductor module 1 including a microminiature image pickup device 10 is disposed at a distal end portion of an electronic endoscope, for example.

At an outer peripheral portion of the light receiving surface 10SA of a semiconductor chip 11 where a light receiving portion 12 is formed, at least one solder bump (hereinafter referred to also as a "bump") 13, which is a first electrode, connected to the light receiving portion 12 is arranged along a side edge. The light receiving portion 12 and the bump 13 are electrically connected together by internal wiring, not shown.

The light receiving portion 12 is configured from a photoelectric conversion device such as a CCD or a CMOS image pickup unit. The solder bump 13 is a protruding solder. Various known compositions may be used as the solder, but from an environmental standpoint, a lead-free solder is desirable. As the lead-free solder, an SnAgCu alloy, an SnZnAl alloy or the like is used. To secure a desirable bonding strength, the height and the diameter of the bump 13 are desirably both 40 µm or more and 100 µm or less. As shown in FIG. 1, the wiring board 20 is a flexible wiring board which uses a flexible resin as a substrate 23 and which includes at least one wire 24 of a conductive material such as copper. A bonding electrode (a second electrode) 26 at a distal end portion of the wire 24 is bonded with the solder bump 13 of the image pickup device 10. Additionally, the wire 24 is not shown in the following drawings. Moreover, the substrate 23 is a laminate of substrates 21, 22 which are two types of materials with different thermal expansion coefficients α. For example, the first substrate 21 is of a polyimide resin ($\alpha 1=13$ ppm/K) with a thickness of 20 µm, and the second substrate 22 is of an epoxy resin ($\alpha 2=65$ ppm/K) with a thickness of 10 µm.

As described later, when heated, the laminate substrate 23, which is a laminate of substrates with different thermal expansion coefficients α, deforms by bending to the side of the substrate 21 with a small thermal expansion coefficient α. That is, the substrate 23 is made of resin, but has a bi-metal function of bending and deforming when heat is applied. Accordingly, the wiring board 20 is bent and deformed when heat is applied.

The wire 24 is disposed on one surface of the substrate 23, but it may alternatively be disposed inside the substrate 23. Also, the wiring board 20 may be a multi-layer wiring board, may have an electronic component such as a chip capacitor mounted on the surface, or may have an electronic component embedded inside.

Additionally, as shown in FIG. 1, according to the semiconductor module 1, one wiring board 20 is bonded to the image pickup device 10. That is, a plurality of bumps 13 are disposed in one line along one side edge of the light receiving surface 10SA. However, it is also possible to have a plurality of wiring boards 20 bonded to the image pickup device 10. For example, a plurality of bumps 13 may be disposed in two lines along opposing two side edges, and two wiring boards may be bonded to the image pickup device.

With the semiconductor module 1, when the wiring board 20 is bent and deformed by being heated to a solder bonding temperature, the bonding electrode (the second electrode) 26 at the distal end portion of the wire 24 is bonded to the bump (a first electrode) 13 of the image pickup device 10 by pressure bonding, that is, by application of pressure.

<Manufacturing Method of Semiconductor Module>

Figure 2:
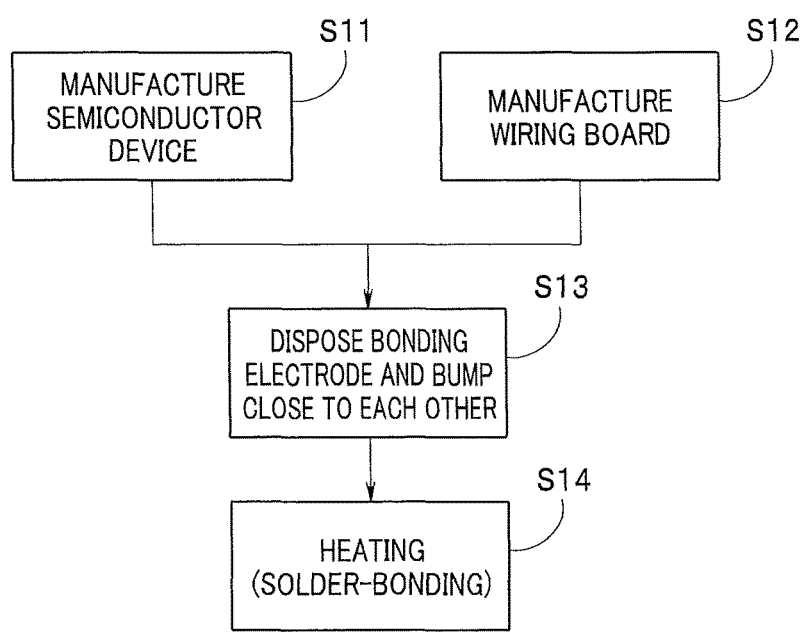
FIG. 2 is a flowchart for describing a manufacturing method of the semiconductor module of the first embodiment.

Next, a manufacturing method of the semiconductor module 1 will be described with reference to the flowchart in FIG. 2.

<Step S11> Semiconductor Device Manufacturing Step

A semiconductor wafer of silicon or the like having provided, to the light receiving surface 10SA, a plurality of light receiving portions 12 and a plurality of bumps 13, which are lined up in the periphery of the light receiving portions 12, is manufactured.

The bumps 13 made of low melting point metal are disposed by electroplating, paste printing, solder ball mounting or the like.

<Step S12> Wiring Board Manufacturing Step

The wiring board 20, which is a laminate of the substrate 21 and the substrate 22 and which has a bi-metal function of predetermined specifications, is manufactured. The wiring board 20 is designed in such a way that, when the wiring board 20 is heated to a solder bonding temperature, a bonding surface 20SA where the bonding electrode 26 is disposed is deformed by being bent inward. That is, the thermal expansion coefficient α2 of the second substrate 22 facing the bonding surface 20SA is larger than the thermal expansion coefficient α1 of the first substrate 21 on the bonding surface 20SA side.

Figure 3A:
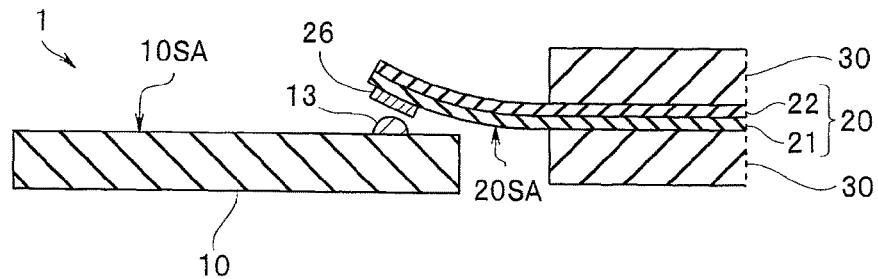
FIG. 3A is a cross-sectional view for describing the manufacturing method of the semiconductor module of the first embodiment.

The amount of bending and deformation at the time of heating is determined by (A) the thermal coefficient ratio of the thermal expansion coefficient α1 of the first substrate 21 and the thermal expansion coefficient α2 of the second substrate 22 (=thermal expansion coefficient α2/thermal expansion coefficient α1), (B) the thickness of the first substrate 21 and the thickness of the second substrate 22, and (C) a bendable/deformable length L (see FIG. 3A, for example).

Accordingly, it is enough if ($\alpha 1<\alpha 2$) is true, but the thermal expansion coefficient ratio is desirably 1.5 or higher, and more desirably, 2 or higher. The upper limit of the thermal expansion coefficient ratio is 30, for example, from the standpoint of restrictions regarding materials and the like.

Additionally, to increase the adhesion strength between the wire 24 and the first substrate 21, the first substrate 21 is desirably of a glass epoxy resin (α=15 ppm/K), polyimide (α=13 ppm/K) or the like having substantially the same thermal expansion coefficient as a conductive metal, such as copper, forming the wire 24.

The first substrate 21 and the second substrate 22 are selected as appropriate from various known materials. For example, a glass epoxy resin (α=15 ppm/K) may be used for the first substrate 21, and an epoxy resin (α=65 ppm/K) may be used for the second substrate. Alternatively, at least one of the first substrate 21 and the second substrate 22 may be of metal.

Furthermore, the substrate 23 may be a bi-metal which is a laminate of the first substrate 21 and the second substrate 22 which are both of metal, and the bonding surface 20SA where the wire 24 is to be disposed may be coated with an insulating resin layer (for example, polyimide). That is, the substrate 23 may be a structure where three or more materials are laminated, and it is enough if the thermal expansion coefficients of two layers are different.

As the bi-metal, a combination of the first substrate 21 of a known low thermal expansion metal, such as an Fe-36Ni alloy (α<1 ppm/K), and the second substrate 22 of a known metal with a general thermal expansion coefficient, such as copper (α=16 ppm/K), iron (α=12 ppm/K), a copper alloy, an iron alloy, or aluminum, is used.

The thickness of the first substrate 21 and the thickness of the second substrate 22 are selected as appropriate. Also, the bendable/deformable length L is selected as appropriate based on the thermal expansion coefficient ratio and the thicknesses of the first substrate 21 and the second substrate 22. For example, the thicknesses of the first substrate 21 and the second substrate 22 are 10 μm or more and 300 μm or less, and the bendable/deformable length L is 50 μm or more and 10 mm or less.

<Step S13> Closely Disposing Step

As shown in FIG. 3A, to be stably held, the rear end side of the wiring board 20 is sandwiched by bonding jigs 30. The length L of bending/deformation is selected as appropriate. Additionally, the bonding jig 30 may stick to and hold one surface of the wiring board 20.

Then, the bonding electrode 26 of the wiring board 20 and the bump 13 of the image pickup device 10 are positioned with respect to each other, and the bonding electrode 26 and the bump 13 are disposed close to each other. Here, the distance between the bonding electrode 26 and the bump 13 is desirably 100 μm or less, and the two may be in contact with each other.

Additionally, to simplify the description, a distal end portion of the wiring board 20 is shown to be greatly bent in FIG. 3A and the like, but in reality, the distal end portion is almost flat or only slightly curved.

<Step S13> Bonding Step

Heating to a predetermined solder bonding temperature is performed in a state where the bonding electrode 26 and the bump 13 are disposed close to each other, and for example, heating is performed until the temperature is 10° C. higher than the solder melting temperature.

Figure 3B:
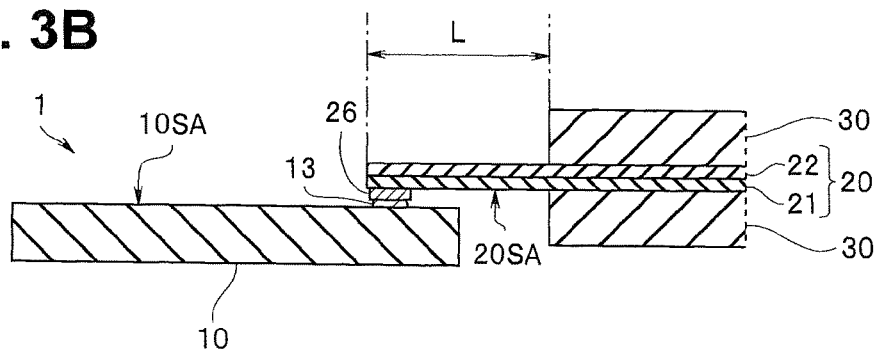
FIG. 3B is a cross-sectional view for describing the manufacturing method of the semiconductor module of the first embodiment.

Then, as shown in FIG. 3B, the second substrate 22 of the wiring board 20 is expanded more than the first substrate 21 due to heating, and the distal end side of the wiring board 20 is deformed by bending toward the bonding surface (20SA). It is desirable that the amount of deformation be such that the bonding electrode 26 moves in the direction of the bump 13 by 10 μm or more and 100 μm or less. The bonding electrode 26 is pressed against the bump 13 by this movement.

That is, with the manufacturing method of the semiconductor module 1, the bonding electrode 26 is pressed against the bump 13 at the time of solder-bonding, without application of external force by an expensive bonding apparatus. Accordingly, the semiconductor module 1 with high bonding reliability, according to which bonding failure is unlikely, may be manufactured by a simple thermal bonding apparatus.

Additionally, because the wiring board 20 is bent and deformed when heated to the solder bonding temperature, a substrate of a shape-memory alloy may be disposed on the wiring board 20. Also, in the embodiment described above, the image pickup device 10 is described as an example of the semiconductor device, but this is not restrictive.

Furthermore, in the embodiment described above, the first electrode 13 is formed as the solder bump, and the second electrode 26 as the bonding electrode, but bonding may be performed with the second electrode 26 as the solder bump.

Second Embodiment

A semiconductor module 1A of a second embodiment and a manufacturing method of the semiconductor module 1A are similar to the semiconductor module 1 and the manufacturing method of the semiconductor module 1, and structural elements having the same functions are denoted by the same reference signs, and description of such structural elements is omitted.

Figure 4A:
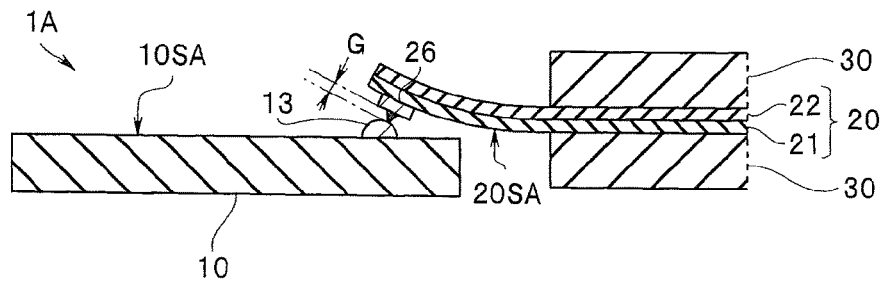
FIG. 4A is a cross-sectional view for describing a manufacturing method of a semiconductor module of a second embodiment.

As shown in FIG. 4A, a bonding electrode 26A of the wiring board 20 of the semiconductor module 1A is a protruding electrode having a protruding portion which has a height G and which is made of metal that does not melt at the solder bonding temperature.

Figure 4B:
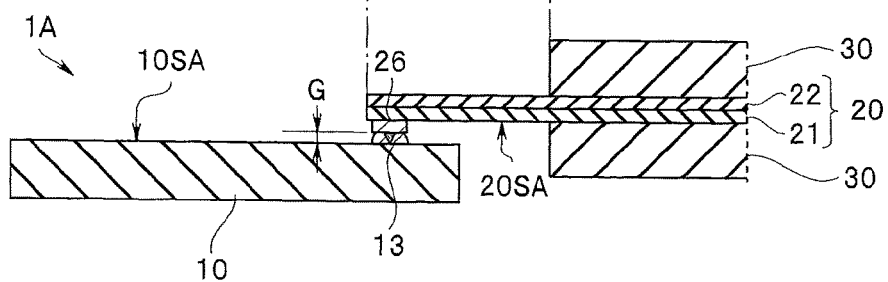
FIG. 4B is a cross-sectional view for describing the manufacturing method of the semiconductor module of the second embodiment.

Accordingly, as shown in FIG. 4B, the protruding portion of the bonding electrode 26A entering the solder which is melted at the time of bonding abuts against the light receiving surface 10SA. According to the semiconductor module 1A, even if a plurality of bonding portions are in different states, the gap between the bonding surface 20SA of the wiring board 20 and the light receiving surface 10SA of the image pickup device 10 is equal to the height G of the protruding portion at every bonding portion. The height G of the protruding portion is desirably about the same height as the bump 13 which is 40 μm or more and 100 μm or less.

The protruding portion of the bonding electrode 26A is a stud bump or a plated bump, for example. A stud bump is fabricated by metal bonding a gold ball which is formed by discharge melting a distal end of a gold wire to a bonding pad by using a wire bonding device, and then cutting the wire. As a plated bump, a copper bump covered with a nickel layer, which is a solder barrier layer, is used, for example.

The semiconductor module 1A achieves the effect of the semiconductor module 1, and is superior in connection reliability.

Third Embodiment

A semiconductor module 1B of a third embodiment and a manufacturing method of the semiconductor module 1B are similar to the semiconductor module 1 and the manufacturing method of the semiconductor module 1, and structural elements having the same functions are denoted by the same reference signs, and description of such structural elements is omitted.

Figure 5A:
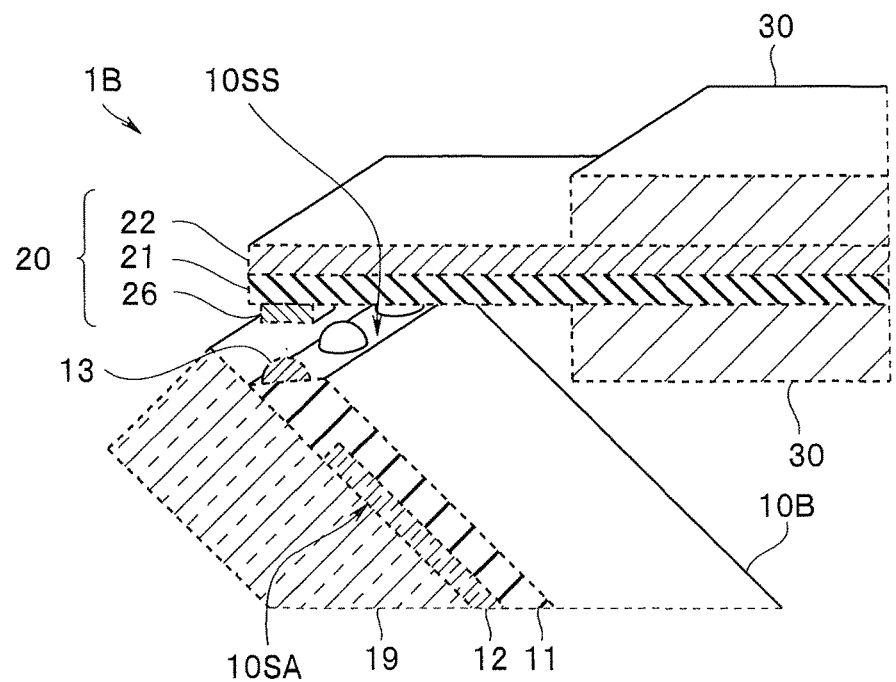
FIG. 5A is a cross-sectional view for describing a manufacturing method of a semiconductor module of a third embodiment.
Figure 5B:
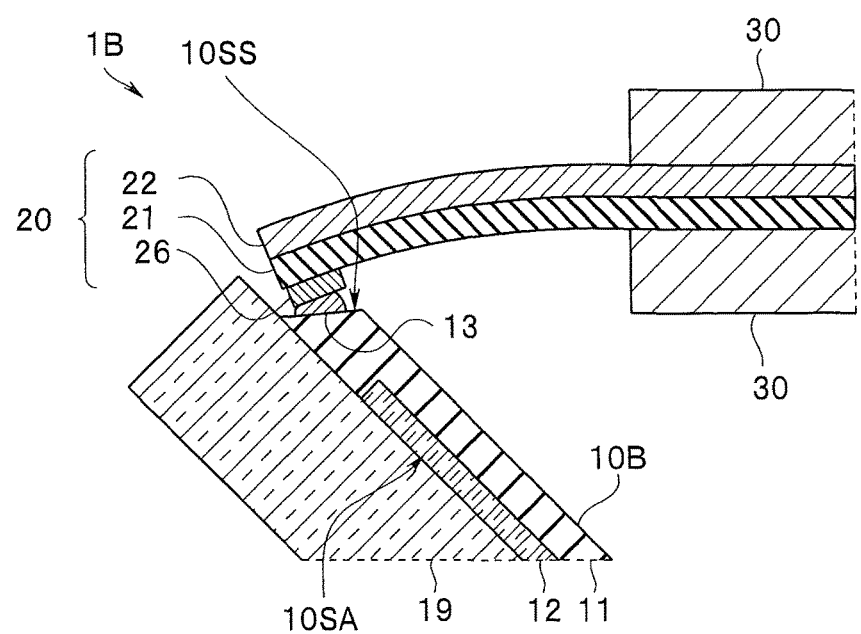
FIG. 5B is a cross-sectional view for describing the manufacturing method of the semiconductor module of the third embodiment.

As shown in FIGS. 5A and 5B, with the semiconductor module 1B, the solder bump 13, which is the first electrode, is disposed on a tapered side surface 10SS of an image pickup device 10B. Also, a cover glass for protecting the light receiving portion 12 is bonded to the light receiving surface 10SA of the image pickup device 10B by a transparent adhesive. The bump 13 is connected to the light receiving portion 12 by a through wire or the like, not shown.

With the semiconductor module 1B, a bonded wafer obtained by bonding a glass wafer to a semiconductor wafer including a plurality of image pickup devices 10B is cut and diced, and a plurality of semiconductor devices with protected light receiving portions 12 are manufactured. Also, because the bump 13 is disposed on a side surface, the connected wiring board 20 does not protrude from the light receiving surface 10SA of the image pickup device 10B, from the side surface. Accordingly, the semiconductor module 1B is more reduced in diameter than the semiconductor module 1.

As shown in FIG. 5B, the wiring board 20 with the bi-metal function is bent and deformed by being heated. The bonding electrode (the second electrode) 26 at the distal end portion of the wire 24 is pressed against the bump (the first electrode) 13 of the image pickup device 10, and thus highly reliable bonding may be easily performed for the semiconductor module 1B.

Fourth Embodiment

A semiconductor module 1C of a fourth embodiment and a manufacturing method of the semiconductor module 1C are similar to the semiconductor module 1 and the manufacturing method of the semiconductor module 1, and structural elements having the same functions are denoted by the same reference signs, and description of such structural elements is omitted.

Figure 6A:
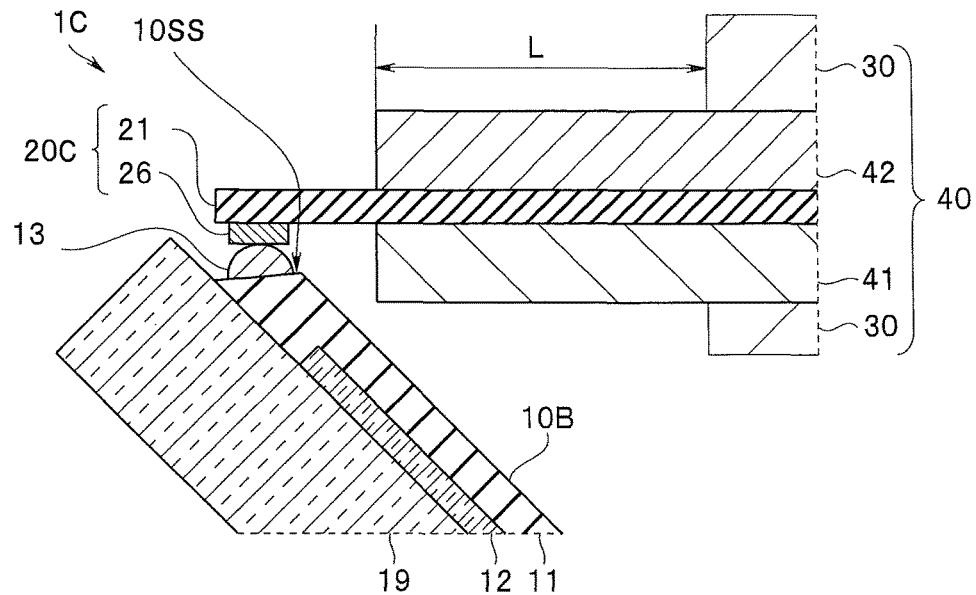
FIG. 6A is a cross-sectional view for describing a manufacturing method of a semiconductor module of a fourth embodiment.

As shown in FIG. 6A, with the semiconductor module 1C, a wiring board 20C is an ordinary wiring board without the bi-metal function. However, the part of a bonding jig 40 configured to hold the wiring board 20C is formed from a first jig 41 whose thermal expansion coefficient is α1 and a second jig 42 whose thermal expansion coefficient is α2, to achieve the hi-metal function. That is, α1 is smaller than α2.

For example, an Fe-36Ni alloy foil (α1<1 ppm/K) with a thickness of 100 μm may be used for the first jig 41, and a stainless steel foil (α2=12 ppm/K) with a thickness of 150 μm may be used for the second jig 42.

Figure 6B:
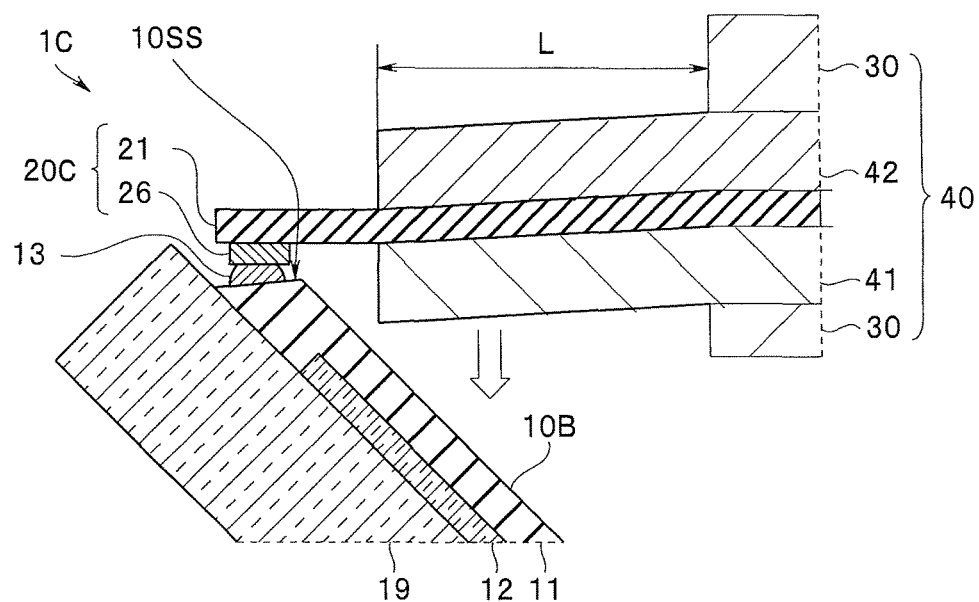
FIG. 6B is a cross-sectional view for describing the manufacturing method of the semiconductor module of the fourth embodiment.

As shown in FIG. 6B, when heated to the solder bonding temperature, the bonding jig 40 having the hi-metal function is bent and deformed, and as a result, the wiring board 20C that is sandwiched is also bent and deformed.

Accordingly, the semiconductor module 1C and the manufacturing method of the semiconductor module 1C achieve the same effect as the semiconductor module 1 and the manufacturing method of the semiconductor module 1.

Moreover, the wiring board 20C of the semiconductor module 1C is an ordinary wiring board, and is inexpensive.

Example Modification

Figure 7:
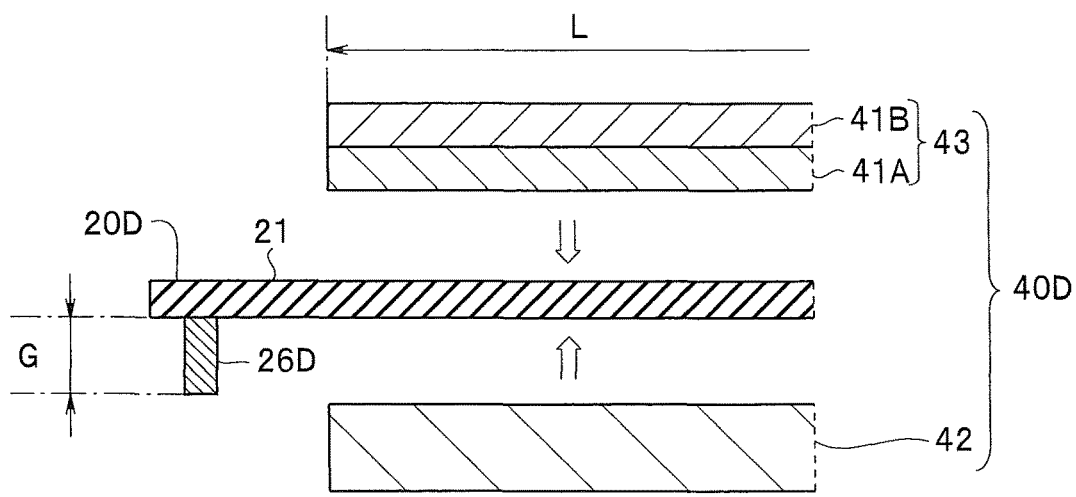
FIG. 7 is a cross-sectional view for describing a bonding jig according to an example modification of the fourth embodiment.

According to a semiconductor module of a first example modification of the fourth embodiment shown in FIG. 7, a bonding electrode (the second electrode) 26D of a wiring board 20D is a protruding electrode which has a height G and which is made of metal that does not melt at the solder bonding temperature.

Moreover, a bonding jig 40D is formed from a first jig 43 which is formed as a bi-metal where two types of metal foils 41A, 41B with different thermal expansion coefficients are bonded together, and a second jig 42 of SUS, for example. When heated, the first jig 43 deforms by bending in the direction of the metal foil 41A.

Although not shown, when heated to the solder bonding temperature, the bonding electrode 26D of the wiring board 20D sandwiched by the first jig 43 and the second jig 42 is pressed against the bump of the semiconductor device due to bending/deformation of the second jig 42.

Figure 8:
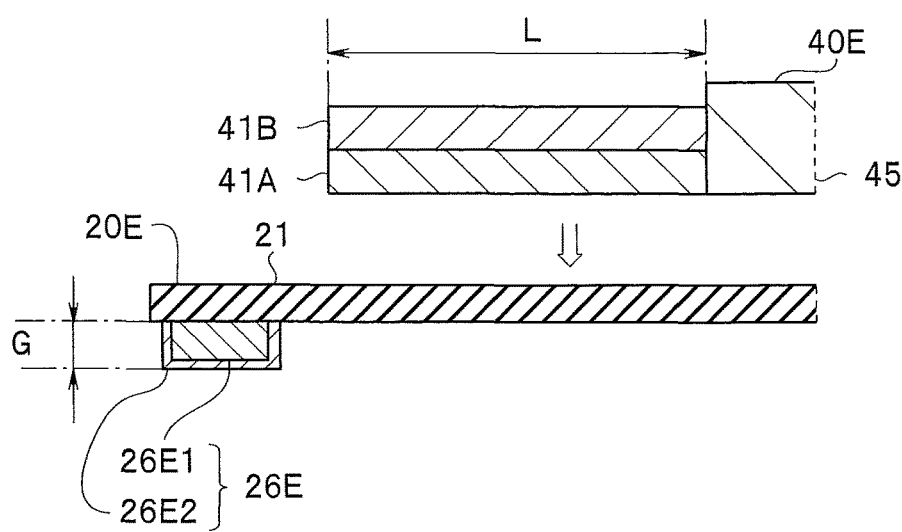
FIG. 8 is a cross-sectional view for describing a bonding jig according to an example modification of the fourth embodiment.

According to a semiconductor module of a second example modification of the fourth embodiment shown in FIG. 8, a bonding electrode (the second electrode) 26E of a wiring board 20E is a protruding electrode which has a height G and which is made of two types of metals that do not melt at the solder bonding temperature. That is, with the bonding electrode 26E, at least a surface on an outer peripheral surface of a copper pad 26E1, which contacts the bump (the first electrode) 13, is covered with an Ni/Au layer 26E2 and has a thickness of G.

Moreover, a bonding jig 40E is formed from a distal end portion which is formed as a bi-metal where two types of metal foils 41A, 41B with different thermal expansion coefficients are bonded together, and a holding portion 45 for sticking to and holding the wiring board 20E.

Although not shown, when heated to the solder bonding temperature, the bonding electrode 26E of the wiring board 20E held by the holding portion 45 of the bonding jig 40E is pressed against the bump of the semiconductor device due to bending/deformation of the distal end portion of the bonding jig 40E.

As described above, the bonding jigs 40, 40D, 40E are each a bonding jig for heating and bonding each of a plurality of bumps (the first electrodes) 13 which are lined up on the image pickup device 10 and each of the bonding electrodes (the second electrodes) 26 at the distal end portions of a plurality of wires 24 of the wiring board 20, and each has the bi-metal function of bending and deforming the wiring board 20C, 20D, 20E being held when heated.

The present invention is not limited to the embodiments and the like described above, and various modifications, alterations and the like may be made within the scope of the present invention.

What is claimed is:

1. A semiconductor module comprising:
   a semiconductor device on which a first electrode is disposed; and
   a flexible wiring board including a wire having a second electrode at a distal end portion solder-bonded to the first electrode, wherein
   the wiring board includes a laminate substrate in which a plurality of substrates with different thermal expansion coefficients are laminated, and
   the second electrode is pressed against the first electrode by bending/deformation of the wiring board caused by application of heat to a solder bonding temperature and by a difference in the thermal expansion coefficients of the plurality of substrates;
   wherein the first electrode is disposed on a tapered side surface of the semiconductor device.

2. The semiconductor module according to claim 1, wherein
   the laminate substrate is a laminate of a first substrate and a second substrate with different thermal expansion coefficients, and
   the first substrate to which the second electrode is bonded has a smaller thermal expansion coefficient than the second substrate.

3. The semiconductor module according to claim 1, wherein the plurality of substrates are made of resin.

4. The semiconductor module according to claim 1, wherein
   the first electrode is a solder bump, and
   the second electrode is a protruding electrode of metal that does not melt at the solder bonding temperature.

5. A bonding jig used for heating and bonding together a first electrode disposed on a semiconductor device and a second electrode at a distal end portion of a wire of a wiring board, wherein
   the bonding jig has a bi-metal function of bending and deforming the wiring board being held by the bonding jig when heated.

6. A manufacturing method of a semiconductor module, the method comprising:
   manufacturing a semiconductor device on which a first electrode is disposed;
   manufacturing a flexible wiring board including a wire having a second electrode at a distal end portion, and a laminate substrate in which the wire is disposed;
   disposing the first electrode and the second electrode close to each other; and
   solder-bonding the semiconductor device and the wiring board, wherein
   the second electrode is pressed against the first electrode by being heated to a solder bonding temperature; and
   the first electrode is disposed on a tapered side surface of the semiconductor device.

7. The manufacturing method of a semiconductor module according to claim 6, wherein the laminate substrate is a laminate of substrates of a plurality of resins with different thermal expansion coefficients, and in the solder-bonding, the wiring board is bent and deformed due to a difference in the thermal expansion coefficients of the plurality of substrates.

8. The manufacturing method of a semiconductor module according to claim 6, wherein of the bonding jig configured to sandwich the wiring board, a part sandwiching the wiring board has a bi-metal function, and
  in the solder-bonding, the bonding jig is bent and deformed due to a difference in the thermal expansion coefficients.

9. The manufacturing method of a semiconductor module according to claim 6, wherein
  the first electrode is a solder bump, and
  the second electrode is a protruding electrode of metal that does not melt at the solder bonding temperature.

* * * * *